United States Patent
Hayes et al.

(10) Patent No.: US 8,651,698 B2
(45) Date of Patent: *Feb. 18, 2014

(54) LIGHTING ASSEMBLIES AND METHODS OF MAKING SAME

(75) Inventors: Earl J. Hayes, South Lyon, MI (US); Jens J. Puetter, Moore, SC (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/476,154

(22) Filed: May 21, 2012

(65) Prior Publication Data

US 2012/0230031 A1 Sep. 13, 2012

Related U.S. Application Data

(63) Continuation of application No. 12/809,860, filed as application No. PCT/US2008/087563 on Dec. 19, 2008, now Pat. No. 8,182,111.

(60) Provisional application No. 61/016,307, filed on Dec. 21, 2007.

(51) Int. Cl.
*F21V 33/00* (2006.01)

(52) U.S. Cl.
USPC ......... 362/249.02; 362/800; 174/261; 257/99

(58) Field of Classification Search
USPC .......... 362/249.02, 249.03, 249.04, 238, 800; 174/261; 257/99
See application file for complete search history.

(56) References Cited

U.S. PATENT DOCUMENTS

| | | | |
|---|---|---|---|
| 4,253,233 A | 3/1981 | Lovrekovic et al. |
| 4,924,362 A | 5/1990 | Janko et al. |
| 6,428,189 B1 | 8/2002 | Hochstein |
| 6,652,795 B2 | 11/2003 | Konishi et al. |
| 7,160,140 B1 | 1/2007 | Mrakovich |
| 7,521,863 B2 | 4/2009 | Tanda |
| 2002/0110000 A1 | 8/2002 | Marcus |
| 2002/0159257 A1 | 10/2002 | Grajcar |
| 2005/0030765 A1 | 2/2005 | Southard et al. |
| 2005/0092517 A1 | 5/2005 | Fan |
| 2005/0116235 A1 | 6/2005 | Schultz |

(Continued)

FOREIGN PATENT DOCUMENTS

| | | |
|---|---|---|
| EP | 1357331 | 10/2003 |
| JP | 2005-50986 | 2/2005 |

(Continued)

OTHER PUBLICATIONS

Robinson, Steven D., *Low-Cost Molded Packaging for Optical Data Links*, IEEE Transactions on Components, Packaging, and Manufacturing Technology—Part B, vol. 18, No. 2, May 1995.

(Continued)

*Primary Examiner* — Laura Tso (57) ABSTRACT

A cable lighting assembly comprising two electrically isolated electrical conductors, and at least one light emitting diode comprising an anode lead and a cathode lead. An electrical joint is formed between the anode lead and one of the electrical conductors, an electrical joint is formed between the cathode lead and the other electrical conductor, and a thermal joint is formed between the light emitting diode and one of the electrical conductors.

12 Claims, 4 Drawing Sheets

(56) References Cited

U.S. PATENT DOCUMENTS

| | | |
|---|---|---|
| 2007/0121326 A1 | 5/2007 | Nall |
| 2007/0241362 A1 | 10/2007 | Han |
| 2008/0277675 A1* | 11/2008 | Fjelstad .......................... 257/88 |

FOREIGN PATENT DOCUMENTS

| | | |
|---|---|---|
| JP | 2006049124 | 2/2006 |
| JP | 2006147744 | 6/2006 |
| JP | 3131410 | 5/2007 |
| WO | WO 90/02906 | 3/1990 |
| WO | WO 2007/041805 | 4/2007 |

OTHER PUBLICATIONS

Brandenburg, Scott D., *Overmolded Electronic Assembly Package,* Advanced Packaging, Jul. 2004.

International Search Report for PCT/US2008/087563, 5 pages, Feb. 27, 2009.

* cited by examiner

LIGHTING ASSEMBLIES AND METHODS OF MAKING SAME

CROSS REFERENCE TO RELATED APPLICATIONS

This application is a continuation of U.S. application Ser. No. 12/809,860, filed Oct. 1, 2010 now U.S. Pat. No. 8,182,111, which is a national stage filing under 35 U.S.C. 371 of PCT/US2008/087563, filed Dec. 19, 2008, which claims priority to Provisional Application No. 61/016,307, filed Dec. 21, 2007, the disclosures of which are incorporated by reference in their entireties herein.

FIELD OF THE INVENTION

The present invention relates to lighting assemblies, in particular, to lighting assemblies using light emitting diodes (LEDs), and more particularly, to cable lighting assemblies with LEDs encapsulated with a polymeric molding material, and methods of making same.

BACKGROUND

Light emitting diodes (LEDs) are used in lighting assemblies. For example, one or more LEDs have been attached to printed circuit boards. One such lighting assembly disclosed in U.S. Published Application No. 2007/0121326 includes a plurality of LEDs electrically attached to a printed circuit board that is overmolded (e.g., by insert molding) with a high thermal conductivity material without covering over the light output apertures of the LEDs. A plurality of these circuit board lighting assemblies are electrically connected to one or more conductors of an insulated flexible electrical cable to form a lighting string. Each of these LED circuit board lighting assemblies is so connected by using a pair of insulation displacing connectors that displace the electrical insulation and electrically connect with the underlying electrical conductors of the electrical cable.

The present invention is an improvement over such prior art lighting assemblies and methods of making same.

SUMMARY

In accordance with one aspect of the present invention, a method is provided for making a cable lighting assembly. The method comprises providing a flexible electrical cable and a relatively fragile electronic device such as, for example, at least one or multiple light emitting diodes (LEDs). The flexible electrical cable comprises two electrically isolated electrical conductors. When the relatively fragile electronic device is a light emitting diode (LED), the LED comprises an anode lead and a cathode lead. The method also comprises mounting the LED to the flexible electrical cable by forming a solder joint between the anode lead of the light emitting diode and one of the electrical conductors and forming another solder joint between the cathode lead of the light emitting diode and the other electrical conductor. A polymeric molding material is injection molded (e.g., insert injection molded) so as to encapsulate the LED and at least a portion of the flexible electrical cable on which the light emitting diode is mounted. The polymeric molding material is injection molded under a sufficiently low injection pressure so as not to damage (e.g., fracture or crack) either solder joint. In addition, at least a portion of the light emitting diode remains exposed (i.e., is not covered over by the polymeric molding material) enough to emit an illuminating light.

The flexible electrical cable can be a flat flexible electrical cable or FFC and the cable can comprise a plurality of spaced apart electrical conductors insulated from one another such as, for example, by being sheathed in and separated by electrical insulation (e.g., an electrically insulating polymeric material). Preferably, the electrical conductors are relatively flat with a generally rectangular cross section. It may be desirable to remove a portion of the electrical insulation to expose multiple surface mounting areas on the surface of one or more of the electrical conductors of the flexible electrical cable, depending on how many electronic devices are to by surface mounted onto the cable and how those electronic devices are to be operated (i.e., the desired electrical circuit design and end use). The desired amount of electrical insulation can be removed by any suitable process including, for example, by laser abrading. One or more of the electrical conductors can each be isolated into two or more electrically isolated surface mounting areas, which are electrically isolated from each other, by removing sections (e.g., by cutting or punching using a mechanical die, a laser, etc.) of the affected conductor. It is preferred to surface mount the light emitting diode or any other electronic device to the electrical conductor by forming a solder joint using a solder paste. The use of solder paste can allow for the rapid formation of the solder joint and at relatively low solder flow temperatures. It is desirable to insert injection mold a thermoplastic polymeric molding material so as to encapsulate (i.e., overmold) the electronic device and the desired length of the flexible electrical cable. Preferably, this length of encapsulated cable includes any exposed mounting areas and any solder joint.

The present method can further comprise soldering a heat slug of the light emitting diode to the conductor on which either the anode lead or the cathode lead is soldered. In addition, the method can further comprise soldering the heat slug of the light emitting diode to the mounting area of the conductor on which either the anode lead or the cathode lead is soldered. In this way, the conductor can function as a heat sink for the LED through its heat slug.

The encapsulated length of the flexible electrical cable is, preferably, sufficiently stiff and inflexible to prevent the flexible electrical cable from flexing or bending enough to damage (e.g., fracture or crack) any solder joint bonding the light emitting diode to the electrical conductor. It can be desirable for the encapsulated length of the flexible electrical cable to include a raised protective ridge (e.g., a continuous or discontinuous ridge of the polymeric molding material) formed around the exposed portion of the light emitting die of the light emitting diode, and the raised protective ridge has an upper edge that is at least level with or extends above the uppermost surface of the light emitting diode.

In another aspect of the present invention a method of making a lighting assembly is provided. The method comprises providing two electrically isolated electrical conductors; providing at least one or multiple light emitting diodes, with each light emitting diode comprising an anode lead and a cathode lead. The method further comprises forming an electrical joint between the anode lead of the light emitting diode and one of the electrical conductors, forming an electrical joint between the cathode lead of the light emitting diode and the other electrical conductor, and forming a thermal joint between the light emitting diode and one of the electrical conductors.

In accordance with another aspect of the present invention, a cable lighting assembly is provided that is made according to any method according to the present invention.

In accordance with an additional aspect of the present invention, a cable lighting assembly is provided that comprises a flexible electrical cable and a relatively fragile electronic device such as, for example, a light emitting diode (LED). The flexible electrical cable comprises two electrically isolated electrical conductors. When the relatively fragile electronic device is a light emitting diode (LED), the LED comprises an anode lead and a cathode lead. The light emitting diode is mounted to the flexible electrical cable with a solder joint formed between the anode lead of the light emitting diode and one of the electrical conductors. Another solder joint is formed between the cathode lead of the light emitting diode and the other electrical conductor. The LED and at least a portion of the flexible electrical cable on which the LED is mounted are encapsulated by a polymeric molding material. It can be preferable for each solder joint to be made using a solder paste. In addition, enough of the LED is exposed (i.e., is not covered over by the polymeric molding material) to emit illuminating light.

In accordance with a further aspect of the present invention, a cable lighting assembly is provided that comprises two electrically isolated electrical conductors, and at least one light emitting diode comprising an anode lead and a cathode lead. An electrical joint is formed between the anode lead and one of the electrical conductors, an electrical joint is formed between the cathode lead and the other electrical conductor, and a thermal joint is formed between the light emitting diode and one of the electrical conductors.

BRIEF DESCRIPTION OF DRAWINGS

The invention may be further understood by reference to the accompanying drawings, wherein like parts are indicated by similar reference numerals throughout the several views.

DETAILED DESCRIPTION OF EMBODIMENTS

Figure 1:
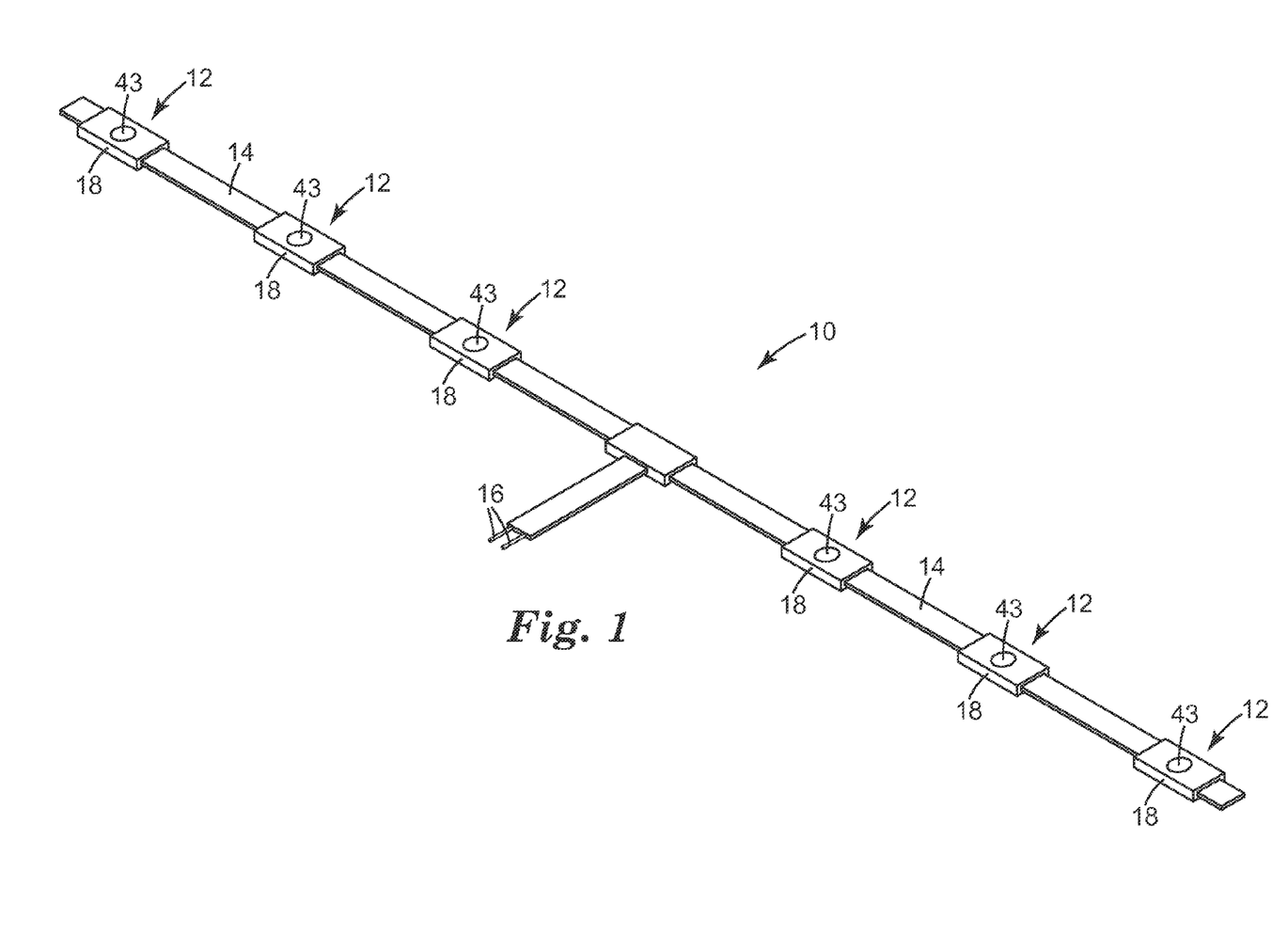
FIG. 1 is a perspective view of a low profile flexible cable lighting assembly in accordance with one embodiment of the present invention.

Referring to FIG. 1, one embodiment of a low profile flexible cable lighting assembly 10 according to the present invention includes a plurality of light emitting diode (LED) assemblies 12 electrically mounted onto a flat flexible electrical cable (FFC) 14. Each LED assembly 12 includes a light emitting diode (LED) 43 and an optional resistor (not shown) that are electrically connected in series, preferably by soldering (e.g., using a solder paste), to one or more electrical conductors 16 of the FFC 14 and encapsulated together onto a corresponding length of the FFC 14 via a molded polymeric material 18. The electrical conductors 16 are in electrical communication with a power source (not shown), for example, through an electrical on/off switch (not shown).

One embodiment of method of manufacturing a cable lighting assembly according to the present invention employs a series of stations where an operation or step in the manufacturing process is performed at each station. At an initial trim station, a desired length of an FFC is cut from a spool of the FFC. The length of FFC has portions of its cable insulation removed by laser ablation at a laser station, in order to expose enough underlying conductor surface to provide the areas needed to surface mount the LED and optional resistor (not shown) for each LED assembly to be mounted on the FFC. One or more openings are then formed through desired conductors of the FFC in accordance with a given electric circuit design using, for example, a mechanical die punch at a punch station. Optionally, the punch station operation can be performed before the laser station operation. A desired amount of solder paste is then dispensed onto each surface mounting area at a solder dispense station. Each of the LEDs, and any other electronic devices to be soldered, are soldered onto its corresponding solder paste coated surface mounting area at a component placement station. A solder reflow station is operated according to a desired solder reflow time and temperature profile to cause each deposit of solder paste to flow so as to form a solder joint between each electronic device and its corresponding surface mounting area(s). The LED and optional resistor is encapsulated with a polymeric molding material at a first overmold station using conventional insert molding equipment. Additional detail about this molding operation is discussed in detail below. Any other electronic device (e.g., a connector, switch, etc.) can likewise be encapsulated at the same or a similar overmold station. It is contemplated that the preceding method may be modified to include additional or fewer manufacturing stations, depending on the design of the particular cable lighting assembly being manufactured.

Figure 2A:
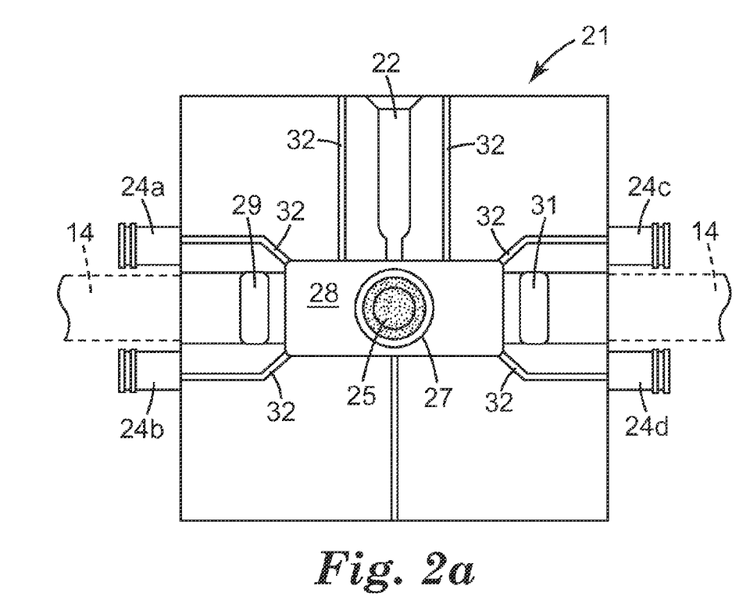
FIGS. 2a and 2b are plan views of one embodiment of an upper and lower die half for insert injection molding an LED that is surface mounted onto an FFC, in accordance with the principles of the present invention.
Figure 2B:
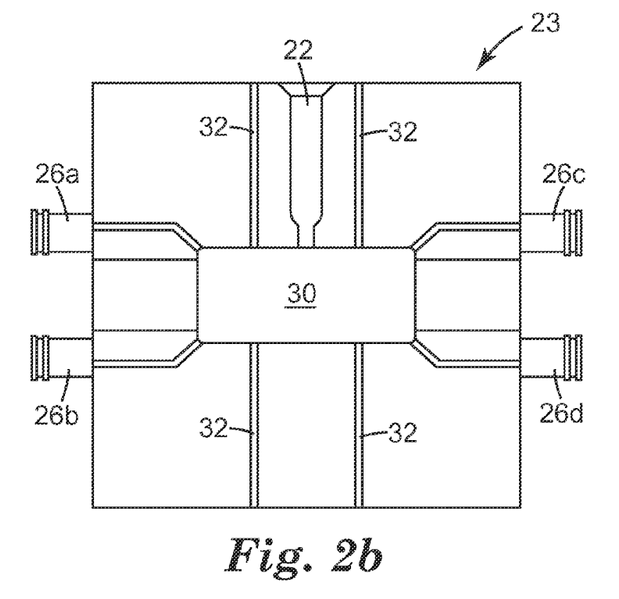

Referring to FIGS. 2a and 2b, one embodiment of an upper die half 21 and a lower die half 23 is shown for insert injection molding an LED that is surface mounted onto an FFC. Together the die halves 21 and 23 form an inlet 22 for injecting the desired polymeric molding material, and each die half 21 and 23 includes coolant circulating ports 24a,b,c,d and 26a,b,c,d, respectively, for cooling the die halves 21 and 23 to a desired temperature during and after the molding process. Each of die half 21 and 23 includes a corresponding cavity half 28 and 30 that, together, define the dimensions of the molded polymeric material 18 that encapsulates the LED assembly 12 (see FIG. 1). The upper die 21 includes an elastomeric seal 25 such as, for example, made of silicone or other rubber-type material, disposed in a corresponding die cavity 27 formed in die half 21, for sealing and protecting the LED light emitting die during the insert molding process.

The seal 25 and cavity 27 are designed and dimensioned to prevent molten polymeric molding material from encapsulating the light emitting portion of the encapsulated LED, while at the same time forming a protective ridge, or other protective structure, of molding material around the light emitting portion of the LED. For sealing the mounted LED 43 of FIG. 4, for example, the seal 25 is generally disc-shaped having a flat face that contacts so as to seal the face 51 of the LED 43, and an outside diameter smaller than the inside diameter of the cavity 27. In addition, the outer peripheral edge of seal 25 has a profile, when combined with the corresponding profile of the cavity 27, designed and dimensioned to form the annular ridge 71 around the exposed surface 51 of the LED 43 (see FIG. 4). Additional elastomeric seals 29 and 31 such as, for example, made of silicone or other rubber-type material can be disposed in corresponding cavities in the die half 21 to seal so as to prevent molding material from squeezing out around the FFC 14 (shown in phantom) at either end of the die halves 21 and 23.

When the die halves 21 and 23 are assembled around the LED mounted FFC for the insert molding operation, each of the seals 25, 29 and 31 has a thickness that results in the seals 25, 29 and 31 compressing so as to exert a sufficiently high compression force against the LED and the FFC, respectively, to block the passage of the molten molding material from the sealed areas. Because elastomeric material is used for seals 25, 29 and 31, the die cavity 28, 30 formed by halves 28 and 30 is filled with polymeric molding material under relatively low pressures to prevent leakage of the molding material past the seals 25, 29 and 31. At the same time, because of the elastomeric nature of the seals 25, 29 and 31 (especially seal 25), it is unlikely that the LED and FFC will be damaged during the molding process. In addition, if more rigid materials (e.g., the metal mold material) were used for seals 25, 29 and 31, higher compression forces would need to be used to prevent leaking of the polymeric molding material. The combination of a more rigid material and higher compression forces increases the likelihood that the LED and to a lesser extent the FFC would become damaged during the injection molding operation. Each of the die halves 21 and 23 includes a plurality of air evacuation channels 32 to avoid the entrapment of air bubbles in the die during the injection molding operation. If the polymeric molding material was injected into the mold cavity under normal injection molding pressures, the seals 25, 29 and 31 would be unable to prevent the molding material from leaking out of the die cavity 28, 30.

Figure 3A:
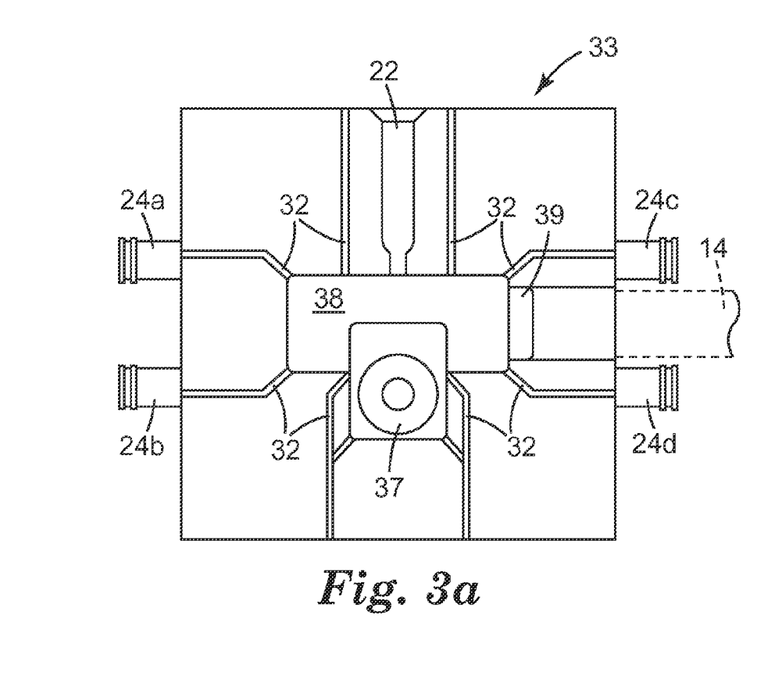
FIGS. 3a and 3b are plan views of one embodiment of an upper and lower die half for insert injection molding an electrical switch that is surface mounted onto an FFC, in accordance with the principles of the present invention.
Figure 3B:
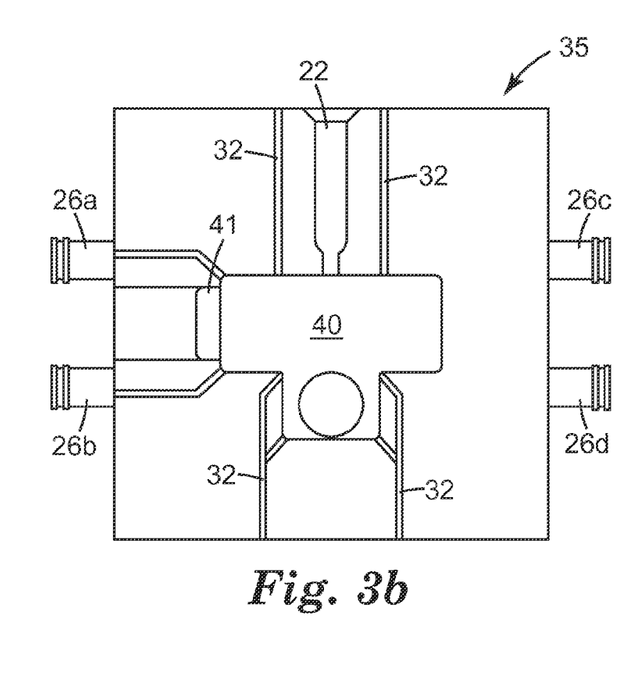

Referring to FIGS. 3*a* and 3*b*, one embodiment of an upper die half 33 and a lower die half 35 is shown for insert injection molding an electrical switch (not shown) that is surface mounted onto an FFC 14 (shown in phantom) in a manner similar to that described above for LED 43. Each of die half 33 and 35 includes a corresponding cavity half 38 and 40 that, together, define the dimensions of the molded polymeric material that encapsulates the electrical switch. Together the die halves 33 and 35 form an inlet 22 for injecting the desired polymeric molding material, and each die half 33 and 35 includes coolant circulating ports 24*a,b,c,d* and 26*a,b,c,d*, respectively, for cooling the die halves 33 and 35 to a desired temperature during and after the molding process. The upper die 33 includes an elastomeric seal 37 such as, for example, made of silicone or other rubber-type material disposed in a corresponding die cavity. The seal 37 is donut or O-ring shaped and dimensioned for sealing and protecting the activator (e.g., a push button) of the electrical switch, where the activator is disposed inside of the hole of the seal 37. Each of the die halves 33 and 35 also includes corresponding elastomeric seals 39 and 41 such as, for example, made of silicone or other rubber-type material for sealing the FFC 14 at one end of the die halves 33 and 35. In the illustrated embodiment, the As with die halves 21 and 23, when the die halves 33 and 35 are assembled around switch mounted FFC for the insert molding operation, each of the seals 37, 39 and 41 has a thickness that results in the seals 37, 39 and 41 compressing so as to exert a sufficiently high compression force against the switch and the FFC, respectively, to block the passage of the molten molding material from the sealed areas. Because elastomeric material is used for seals 37, 39 and 41, the die cavity 38, 40 formed by halves 38 and 40 is filled with polymeric molding material under relatively low pressures to prevent leakage of the molding material past the seals 37, 39 and 41. At the same time, because of the elastomeric nature of the seals 37, 39 and 41, it is unlikely that the switch and FFC would be damaged during the molding process. In addition, if more rigid materials (e.g., the metal mold material) were used for seals 37, 39 and 41, higher compression forces would need to be used to prevent leaking of the polymeric molding material. The combination of a more rigid material and higher compression forces increases the likelihood that the switch and to a lesser extent the FFC would become damaged during the injection molding operation. Each of the die halves 33 and 35 includes a plurality of air evacuation channels 32 to avoid the entrapment of air bubbles in the die during the injection molding operation. If the polymeric molding material was injected into the mold cavity under normal injection molding pressures, the seals 37, 39 and 41 would be unable to prevent the molding material from leaking out of the die cavity 28, 30.

Figure 4:
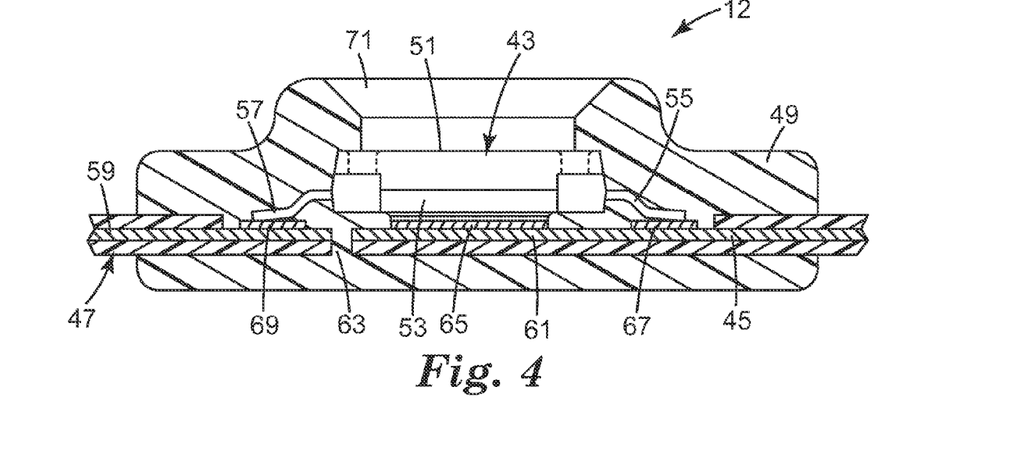
FIG. 4 is a cross sectional view of an LED that has been surface mounted onto a conductor of a flat flexible electrical cable and over-molded in accordance with an embodiment of the present invention.

Referring to FIG. 4, an LED 43 is shown that has been surface mounted onto a flat (i.e., rectangular cross section) conductor 45 of a flat flexible electrical cable 47 and encapsulated by a polymeric molding material 49. The LED 43 includes a light emitting die (not shown) that emits light through surface 51, a heat slug 53, an anode lead 55 and a cathode lead 57. The conductor 45 is separated into two electrically isolated lengths 59 and 61 by the punched out opening 63. The heat slug 53 and the anode lead 55 are separately bonded electrically to the conductor length 61 by respective solder joints 65 and 67. The cathode lead 57 is bonded electrically to the conductor length 59 by solder joint 69. The molding material 49 preferably includes an annular protective ridge 71 around the surface 51. The protective ridge 71 is raised with an upper edge that is at least level with or extends above the light emitting surface 51.

Figure 5:
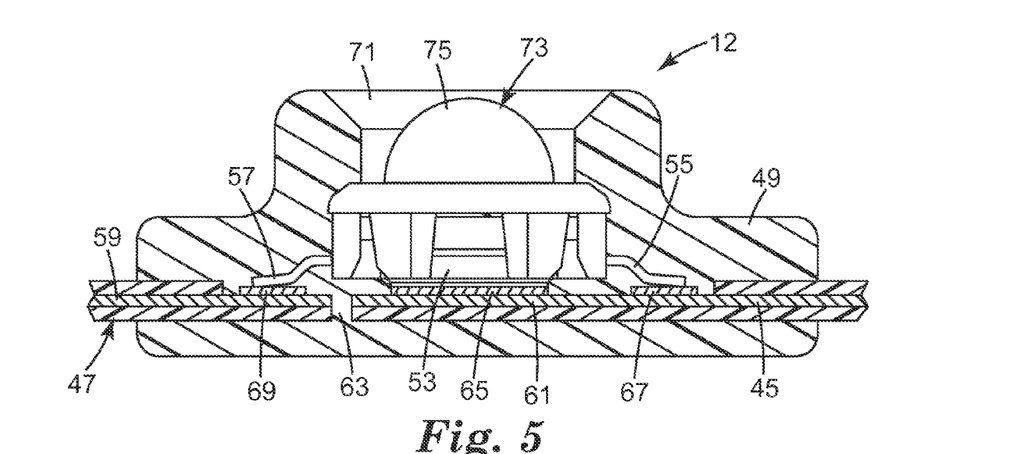
FIG. 5 is a cross sectional view of a different LED, with a protective lens, that has been surface mounted onto a conductor of a flat flexible electrical cable and over-molded in accordance with another embodiment of the present invention.

Referring to FIG. 5, a different LED 73 is shown that has been surface mounted onto a flat (i.e., rectangular cross section) conductor 45 of a flat flexible electrical cable 47 and encapsulated by a polymeric molding material 49. The LED 73 includes a light emitting die (not shown) that emits light through a protective lens 75, a heat slug 53, an anode lead 55 and a cathode lead 57. The conductor 45 is separated into two electrically isolated lengths 59 and 61 by the punched out opening 63. The heat slug 53 and the anode lead 55 are separately bonded electrically to the conductor length 61 by respective solder joints 65 and 67. The cathode lead 57 is bonded electrically to the conductor length 59 by solder joint 69. The molding material 49 preferably includes an annular protective ridge 71 around the protective lens 75. The protective ridge 71 is raised with an upper edge that is at least level with or extends above the light emitting lens 75.

Exemplary light emitting diodes (LEDs) that can be used according to the present invention may include, without limitation, an LW M5SM Golden DRAGON® LED with Chip Level Conversion; an LW M5KM Golden DRAGON® ARGUS® LED with Chip Level Conversion; and an LD W5AP, LB W5AP or LT W5AP Diamond DRAGON® LED, each manufactured by OSRAM Opto Semiconductors GmbH, located at Wernerwerkstrasse 2, D-93049 Regensburg, Germany (www.osram-os.com).

An exemplary flat flexible electrical cable (FFC) that can be used according to the present invention may include, without limitation, the flat flexible electrical cable sold by LEONI Kabel GmbH, located at Stieberstratβe 5, 91154 Roth, Germany (www.leoni-cable.com). This FFC comprises three spaced apart copper electrical conductors sheathed in and separated by the electrically insulating polymeric material PBT. In order to avoid heat related damage to the insulation of such FFCs, it has been found desirable to solder components onto the FFC using relatively low temperature solder paste (e.g., a solder paste that forms a solder joint at a temperature lower than a comparable solid solder).

An exemplary type of solder paste that can be used according to the present invention may include, without limitation, the SolderPlus® NCLR series of No-Clean dispensable solder pastes manufactured by EFD Inc., located at 14 Blackstone Valley Place, Lincoln, R.I. 02865 U.S.A. (www.efdsolder.com). These solder pastes feature low flux residue and superior wetting, can be relatively quickly and easily dispensed at room temperature, and can form solder joints in relatively short time periods of nominally about 3 minutes and at relatively low temperatures between about 138° C. up to about 153 to 178° C. While known to be used in forming solder joints on circuit boards, such dispensable solder pastes have been found, however, to be undesirable for use on flexible (i.e., not stiff) electrical cables. The solder joints resulting from using solder pastes have been found to be relatively brittle and susceptible to cracking when subjected to bending stresses such as, for example, the kind of bending stresses experienced by solder joints formed in mounting an LED onto a conductor of a flexible cable such as, for example, an FFC. In order to combine the use of a solder paste, and therefore its advantages, with a flexible electrical cable, it has been found that this discovered shortcoming of solder pastes can be overcome by molding over the soldered LED and a length of the flexible cable on either side of which the LED is soldered.

Exemplary insert moldable materials that can be used according to the present invention may include, without limitation, the hot melt resins commercially available from Bostik, Inc. of Middleton, Mass. or the like. Such resins include BOSTIK® LPM 245 adhesive, BOSTIK® LPM 915 adhesive, BOSTIK® LPM 917 adhesive and/or the like. Other suitable resins or materials may include, for example, HENKEL®/LOCTITE® Macromelt materials, such as HENKEL® OM673, 678, 682 and/or 687 Macromelt and/or the like.

Conventional insert molding techniques typically include injecting thermoplastic polymeric molding material into a sandwiched pair of mold die halves under injection pressures exceeding 1000 pounds per square inch (psi). Such molding operations have been known to use pressures for injecting thermoplastic polymeric molding materials into a mold in ranges as high as from 3000 psi to 7000 psi. In order to prevent flashing of the molding material between the die halves of the conventional mold, the die halves are pressed together under clamping pressures that can significantly exceed the molding material injection pressures. It has been discovered that such conventional injection molding techniques can have undesirable results when used to mold over relatively delicate electronic devices such as, for example, an LED that has been surface mounted to the conductor of a flexible cable using a solder joint. This is especially true with regard to such a solder joint made from a solder paste.

When injected into the mold cavity under such high pressures, the force exerted by the injected molding material against the surface mounted LED can cause a portion or all of the solder joint(s) to fracture and, thereby, cause a corresponding portion or all of the LED to move partially or completely off of its original surface mounted location and lose some or all of its electrical connection to the flexible cable. A solution to this problem has been discovered that includes molding over such a surface mounted LED and flexible cable using relatively low injection molding pressures of less than 1000 pounds per square inch or psi (6895 kilopascals or kPa), desirably less than about 800 psi (5516 kPa), less than about 600 psi (4137 kPa), less than or equal to about 400 psi (2758 kPa), and preferably in the range of from about 120 psi (827.4 kPa) up to and including about 400 psi (2758 kPa). Such low injection molding pressures enable correspondingly low clamping pressures to be used, between the two mold die halves, without the molding material flashing between the die halves. For insert molded electronic devices that require a particular surface to remain exposed (e.g., the light emitting surface of an LED, or the on/off button of an electric switch) after the device is insert molded, such low injection molding pressures and corresponding die halve clamping pressures enable the use of resilient mold die components (e.g., made from an elastomeric polymer material such as, for example, silicone rubber) to seal off such exposed surfaces against flashing of the molding material. Injection molding dies are typically made of a metal such as, for example, tool steel. Resilient mold die components that resiliently seal and prevent flashing of the molding material can be very important when used to protect exposed surfaces of relatively delicate electronic devices such as, for example, LEDs. If the typical die mold metal material was used to seal off such surface to be left exposed, the clamping pressures needed to prevent flashing could damage the surface of the electronic device to be sealed off from flashing.

The light emitting portion of an LED, which needs to be left exposed, is its die. The LED die is relatively fragile and more likely to survive clamping pressures exerted by a resilient mold die component (e.g., silicone rubber) than the same clamping pressures, let alone higher pressures, exerted by a mold die component made of metal. The use of a resilient mold die component, in this way, can also allow the mold die to compensate for greater variations in the dimensional tolerances of the electronic device. If a mold die component made of metal or another stiff and hard material is used to seal off the surface of the electronic device to be left exposed, there would be a greater likelihood of either damaging the electronic devices that are dimensionally larger than the mold was designed to accommodate or not sufficiently sealing off the exposed surface of electronic devices that are dimensionally smaller than the mold was designed to accommodate.

Desirable results have been obtained using a SolderPlus® 42NCLR dispensable solder paste to electrically surface mount an LED to a conductor of a flexible electrical cable. A measured amount of the solder paste was dispensed at each desired solder joint location on a previously exposed conductor surface, using a cycle time per shot of about 1.5 seconds at room temperature (i.e., about 20° C.). After the solder paste is dispensed and the LED positioned at the surface mount location, the solder paste was exposed to a reflow time-temperature profile that causes the solder paste to melt, flow and react so as to form a solder joint that bonds and electrically connects the LED to the flexible cable conductor. The reflow time-temperature profile started with a pre-heating that ramped up linearly from about 30° C. to about 100° C. in about 60 seconds, followed by a heat soak that started from the about 100° C. and linearly ramped up to about 130° C. in about 75 seconds, followed by an activation step that started from the about 130° C. and linearly ramped up to about 138° C. in about 20 seconds, followed by a reflow step that started from the about the 138° C. and linearly ramped up to a maximum temperature of about 178° C. in about 45 seconds, followed by an initial cool down step that started from the about 178° C. and linearly ramped down to a temperature of about 138° C., and followed by a final cool down step that started from the about 138° C. and linearly ramped down to a temperature of about 30° C. The entire cooling down process (i.e., the last two steps take about 40 seconds.

Desirable results have also been obtained by insert molding over such a surface mounted LED using the hot melt resin commercially available from Bostik, Inc., of Middleton, Mass., under the product name BOSTIK® LPM 917 adhesive. This thermoplastic resin material was injected at a temperature of about 225° C., at an injection pressure in the range of from about 220-280 psi, and with a cycle time for molding over each LED in the range of from about 12 to 15 seconds. Such low injection molding pressures enabled the use of clamping pressures, between the two mold die halves, of approximately 800 psi or less.

It has been found to be desirable to use the flat flexible electrical cable sold under the part number 67403000A by LEONI Kabel GmbH. This FFC has three electrical conductors and an overall width of 13.50 mm±0.15 mm. Each of the electrical conductors is relatively flat with a generally rectangular cross section. Each of the conductors has a thickness of about 0.1 mm. The center conductor has a width of about 6.62 mm and each of the two outer conductors has a width of about 1.54 mm. The center conductor was used for surface mounting the LED. It is preferable to use the much wider center conductor to surface mount the LED. While the additional width of the center conductor is not needed to provide a sufficient electrical connection to the LED (i.e., to handle the current needs of the LED), the additional width enables the center conductor to better function as a heat sink for conducting heat, generated by its operation, away from the LED. The wider center conductor also provides more of a target surface area on which a solder joint can be formed. This FFC has a minimum bend radius of about 0.45 mm and an operating temperature rated at about 125° C. for 3000 hours.

For LEDs such as the above described DRAGON® LEDs manufactured by OSRAM Opto Semiconductors GmbH, with its heat slug electrically connected to its anode lead, the heat slug can be soldered directly to the FFC conductor. This facilitates the heat sink function of the conductor and simplifies the manufacturing process. For those LEDs that have their heat slug electrically isolated from both their anode and cathode leads, a thermally conductive but electrically insulative adhesive can be used to attach the LED heat slug to the FFC conductor. An example of such an intermediate adhesive is a high adhesion thermally conductive adhesive transfer tape manufactured by 3M Company, located in St. Paul, Minn., under the product number series 8800. Desirable results have been obtained using the 3M Company transfer tape 8810.

What is claimed is:

1. Method of making a cable lighting assembly, said method comprising:
providing a flexible electrical cable comprising two electrically isolated electrical conductors;
providing at least one light emitting diode, with each light emitting diode comprising an anode lead and a cathode lead;
mounting the light emitting diode to the flexible electrical cable by forming a solder joint between the anode lead of the light emitting diode and one of the electrical conductors and forming another solder joint between the cathode lead of the light emitting diode and the other electrical conductor; and
injection molding a polymeric molding material so as to encapsulate each light emitting diode and a portion of the flexible electrical cable on which each light emitting diode is mounted,
wherein the polymeric molding material is injection molded under a sufficiently low injection pressure so as not to damage either solder joint, and at least a portion of each light emitting diode remains exposed enough to emit an illuminating light.

2. The method according to claim 1, wherein each encapsulated length of the flexible electrical cable is sufficiently stiff and inflexible to prevent the flexible electrical cable from flexing enough to damage the solder joint bonding the corresponding light emitting diode to the electrical conductor.

3. The method according to claim 1, wherein each encapsulated length of the flexible electrical cable includes a raised protective ridge formed around the exposed portion of the light emitting die of the light emitting diode, and the raised protective ridge has an upper edge that is at least level with the uppermost surface of the corresponding light emitting diode.

4. The method according to claim 1, wherein said injection molding is performed at an injection molding pressure of less than 6895 kPa.

5. The method according to claim 1, wherein said injection molding is performed at an injection molding pressure of less than about 4137 kPa.

6. The method according to claim 1, wherein said injection molding is performed at an injection molding pressure in the range of from about 827.4 kPa up to and including about 2758 kPa.

7. The method according to claim 1, wherein said step of providing at least one light emitting diode comprises providing a plurality of the light emitting diodes.

8. A cable lighting assembly made according to the method of claim 1.

9. A cable lighting assembly comprising:
a flexible electrical cable comprising two electrically isolated electrical conductors; and
a light emitting diode comprising an anode lead and a cathode lead, said light emitting diode being mounted to said flexible electrical cable with a solder joint being formed between said anode lead and one of said electrical conductors, and another solder joint being formed between said cathode lead and the other electrical conductor,
wherein said light emitting diode and at least a portion of said flexible electrical cable on which said light emitting diode is mounted are encapsulated by a polymeric molding material, and at least a portion of said light emitting diode is exposed enough to emit an illuminating light.

10. The assembly according to claim 9, wherein the encapsulated portion of the flexible electrical cable is sufficiently stiff and inflexible to prevent the flexible electrical cable from flexing enough to damage the solder joint bonding the light emitting diode to either electrical conductor.

11. The assembly according to claim 9, wherein the encapsulated portion of the flexible electrical cable includes a raised protective ridge formed around the exposed portion of the light emitting diode, and the raised protective ridge has an upper edge that is at least level with an uppermost surface of the light emitting diode.

12. The assembly according to claim 9, further comprising a plurality of light emitting diodes, wherein each light emitting diode comprising an anode lead and a cathode lead, each light emitting diode and a portion of said flexible electrical cable on which said light emitting diode is mounted are separately encapsulated by a polymeric molding material, and at least a portion of each light emitting diode is exposed so that light emitted from each light emitting diode is an illuminating light.

* * * * *

UNITED STATES PATENT AND TRADEMARK OFFICE
CERTIFICATE OF CORRECTION

| | | |
|---|---|---|
| PATENT NO. | : 8,651,698 B2 | Page 1 of 1 |
| APPLICATION NO. | : 13/476154 | |
| DATED | : February 18, 2014 | |
| INVENTOR(S) | : Earl James Hayes | |

It is certified that error appears in the above-identified patent and that said Letters Patent is hereby corrected as shown below:

In the Specification

Column 6
Line 59, delete "Stieberstratβe" and insert -- Stieberstraβe --

Signed and Sealed this
Twenty-fourth Day of June, 2014

Michelle K. Lee
*Deputy Director of the United States Patent and Trademark Office*